United States Patent [19]

Srivastava

[11] Patent Number: 5,200,712
[45] Date of Patent: Apr. 6, 1993

[54] VARIABLE SPEED PHASE LOCKED LOOP

[75] Inventor: Gopal K. Srivastava, Arlington Heights, Ill.

[73] Assignee: Zenith Electronics Corporation, Glenview, Ill.

[21] Appl. No.: 813,461

[22] Filed: Dec. 26, 1991

[51] Int. Cl.$^5$ .......................... H03L 7/093; H03L 7/18
[52] U.S. Cl. ..................... 331/1 A; 331/10; 331/16; 331/25
[58] Field of Search ............ 331/1 A, 10, 15, 16, 331/18, 25, DIG. 2

[56] References Cited

U.S. PATENT DOCUMENTS 4,714,899 12/1987 Kurtzman et al. ............ 331/17 X
4,980,653 12/1990 Shepherd ........................ 331/16

Primary Examiner—David Mis

[57] ABSTRACT

A variable speed phase locked loop includes a phase detector and a voltage controlled oscillator, the output of which is provided through a divider circuit to the phase detector. A plurality of delay elements and a decoder divide the period of the phase detector input signal into discrete portions for enabling a plurality of weighted current sources. The current sources are coupled to the phase detector and change its gain. In the locked condition with minimum phase error, the gain of the phase detector is at a minimum and is progressively increased to a maximum when the phase error is maximum.

9 Claims, 3 Drawing Sheets

VARIABLE SPEED PHASE LOCKED LOOP

BACKGROUND OF THE INVENTION AND PRIOR ART

Backqround of the Invention and Prior Art

This invention relates generally to phase locked loops and particularly to a variable speed phase locked loop that includes a variable gain phase detector for optimizing the pull-in range and noise immunity of the phase locked loop (PLL).

PLL's and phase detectors are well known in the art. The output of the phase detector is used to control the oscillator to reduce the error between the input signal and the reference signal and produce a locked condition. It is desirable for optimum signal pull-in performance to maximize the phase detector gain for controlling the oscillator when the input and reference signals are relatively far apart, i.e. when a maximum phase error is present. On the other hand, for stability, it is desirable to minimize the phase detector gain when the two signals exhibit a minimum absolute phase and the PLL is in the locked condition. Prior art attempts to achieve this desirable operating characteristic have been compromises in which the PLL has one gain when in a locked condition and a higher gain when in an unlocked condition.

OBJECTS OF THE INVENTION

A principal object of the invention is to provide a novel variable speed phase locked loop.

Another object of the invention is to provide a phase locked loop that includes a phase detector, the gain of which is controlled in increments as the locked condition is approached.

A further object of the invention is to provide a low cost, variable speed phase locked loop that is readily manufactured.

BRIEF DESCRIPTION OF THE DRAWINGS

These and other objects and advantages of the invention will be apparent upon reading the following description in conjunction with the drawings, in which.

DESCRIPTION OF THE PREFERRED EMBODIMENT

Figure 1:
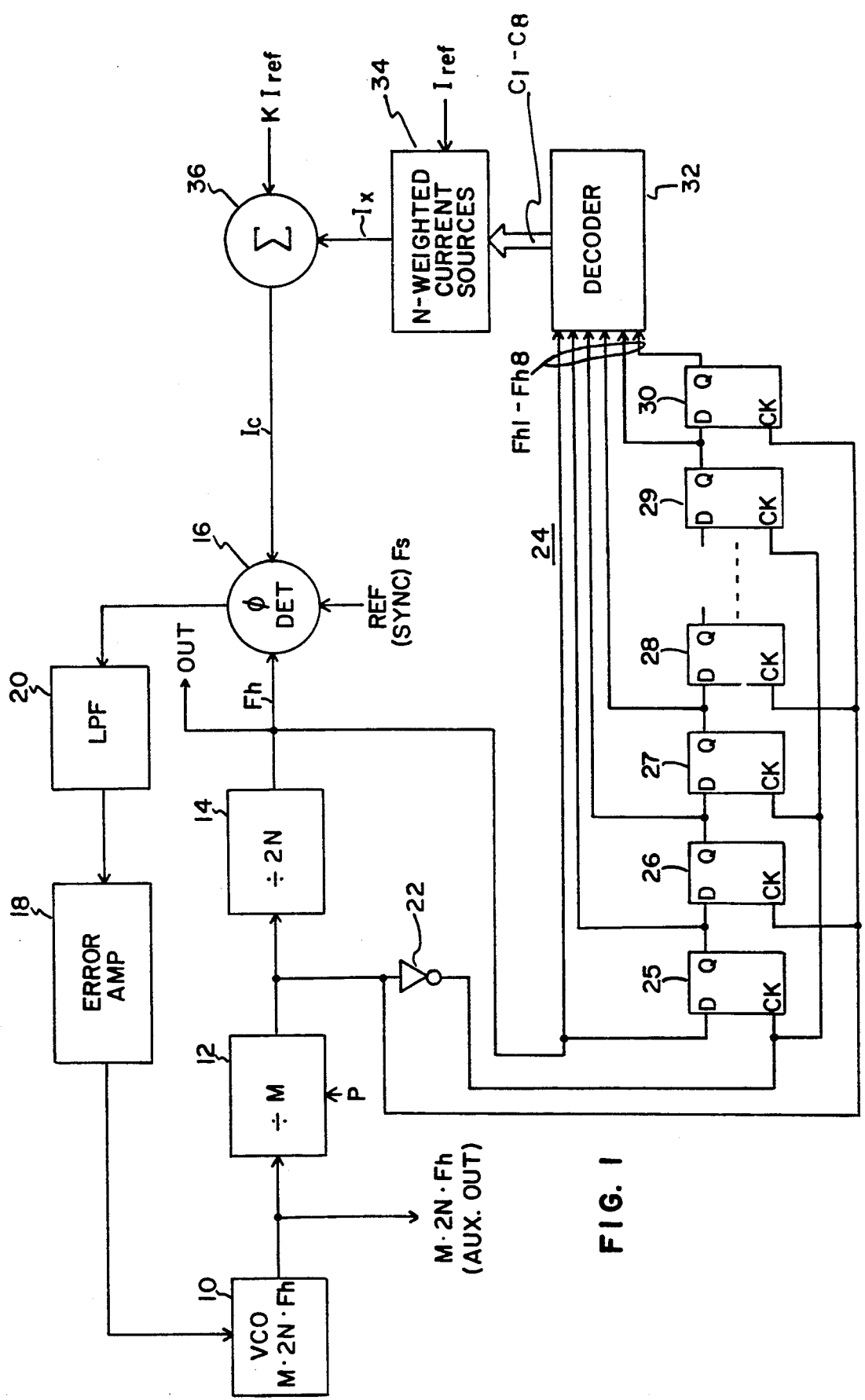
FIG. 1 is a partial block diagram of a phase locked loop constructed in accordance with the invention.

In FIG. 1, a PLL includes a voltage controlled oscillator (VCO) 10 coupled to a divider circuit 12 that in turn is coupled to another divider circuit 14. Divider circuit 12 divides by a factor M and divider circuit 14 divides by a factor 2N. The output of divider circuit 14 is coupled to the input of a phase detector 16 which also receives an input from an adder circuit 36 and a reference signal input Fs. Fs is indicated as being a sync signal with the intended use of the PLL being in a television receiver. The output of phase detector 16 is coupled to a low pass filter 20 which in turn is coupled to an error amplifier 18, the output of which is used to control the frequency of VCO 10. With the exception of the divider circuits 12 and 14, the arrangement is a conventional PLL with a reference frequency of Fs. The output signal of the PLL is Fh although an auxiliary output of 2 NMFh is also available. Divider circuit 12 has an input P to indicate that it is programmable and may be changed by suitable means, such as a microprocessor for example. As will be seen, the divider circuit 12 enables the phase locked loop to be used in tuning systems and the like where a relatively large spectrum of signal frequencies is covered as distinct from being used in a detector arrangement where a single input signal frequency is encountered, e.g. in a synchronous detector for a television receiver IF signal.

A plurality of flip-flops 25, 26, 27, 28, 29 and 30 are coupled in a delay arrangement. The clock inputs of the flip-flop 25 and subsequent odd numbered flip-flops receive the inverted output of the divider 12, whereas the clock inputs of flip-flop 26 and the subsequent even numbered flip-flops are connected to the non-inverted output of the divider 12. Successive flip-flops have their Q outputs connected to the next successive flip-flop and to a decoder 32. The output of decoder 32 is coupled to a block 34, labelled N-Weighted Current Sources with the output of block 34 being coupled to an input of adder 36. Another input of adder 36 is a constant K Iref which is a reference current, generally corresponding to a minimum gain condition for phase detector 16. Iref is also applied to the N-Weighted Current Sources in block 34.

Figure 2:
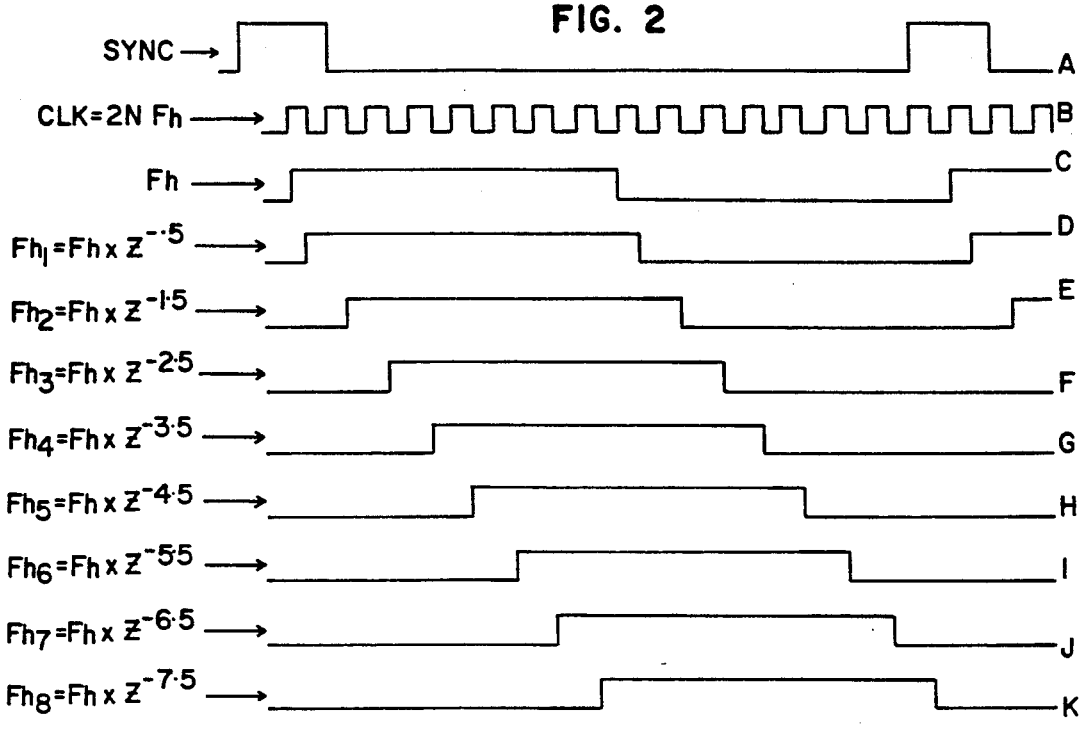
FIG. 2 is a series of waveforms illustrating the development of a gain control signal for the phase detector of the phase locked loop of FIG. 1.
Figure 2:
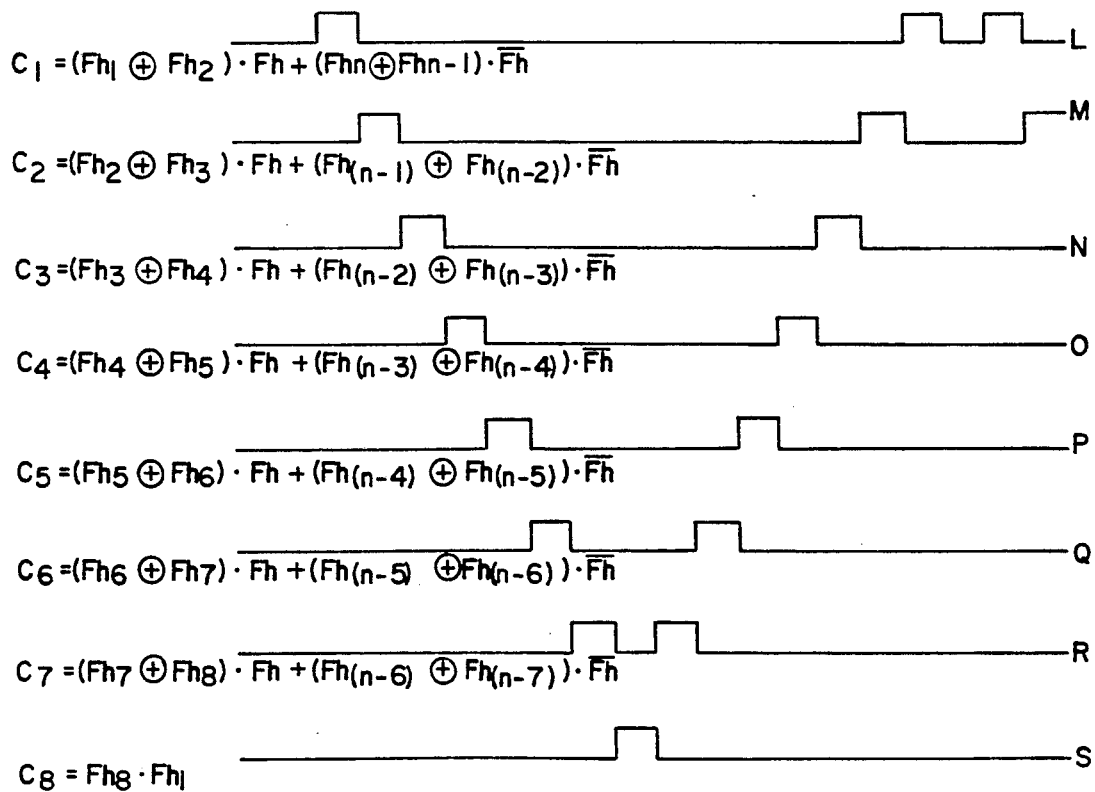

As is well known, for optimum noise performance and speed of pull in, the phase detector should have minimum gain when in its locked condition (corresponding to minimum absolute phase error, i.e. 90 degrees) and maximum gain when in its unlocked condition (corresponding to maximum absolute phase error, i.e. 180 degrees). The PLL circuit arrangement of FIG. 1 divides the period of the input signal into eight equal parts. The phase relationship between the reference signal and the input signal is then used to determine the gain of the phase detector, which in the preferred embodiment, is accomplished in discrete steps. Reference to FIG. 2 shows how the period of the input sync signal is divided into eight equal portions. The timing waveforms labelled A-S are in vertical time alignment and indicate how the switching signals on leads C1-C8 are developed for turning on the corresponding current sources, such as those partially indicated schematically in FIG. 3. The delay arrangement of the flip-flops 25-30 (FIG. 1) produces the waveforms D to K and the decoder 32 develops the control signals C1-C8. The relative position of the sync signal (waveform A) to the leading edge of Fh (waveform C) and the clock signal (waveform B), in conjunction with the decoder 32, determines which current sources are activated by the signals C1-C8. The current sources are weighted so that when each is activated, a proportionately greater current flows to produce a corresponding greater gain for the phase detector. Other techniques for increasing the gain of the phase detector when going from the locked to the unlocked condition of the PLL may also be employed.

Figure 3:
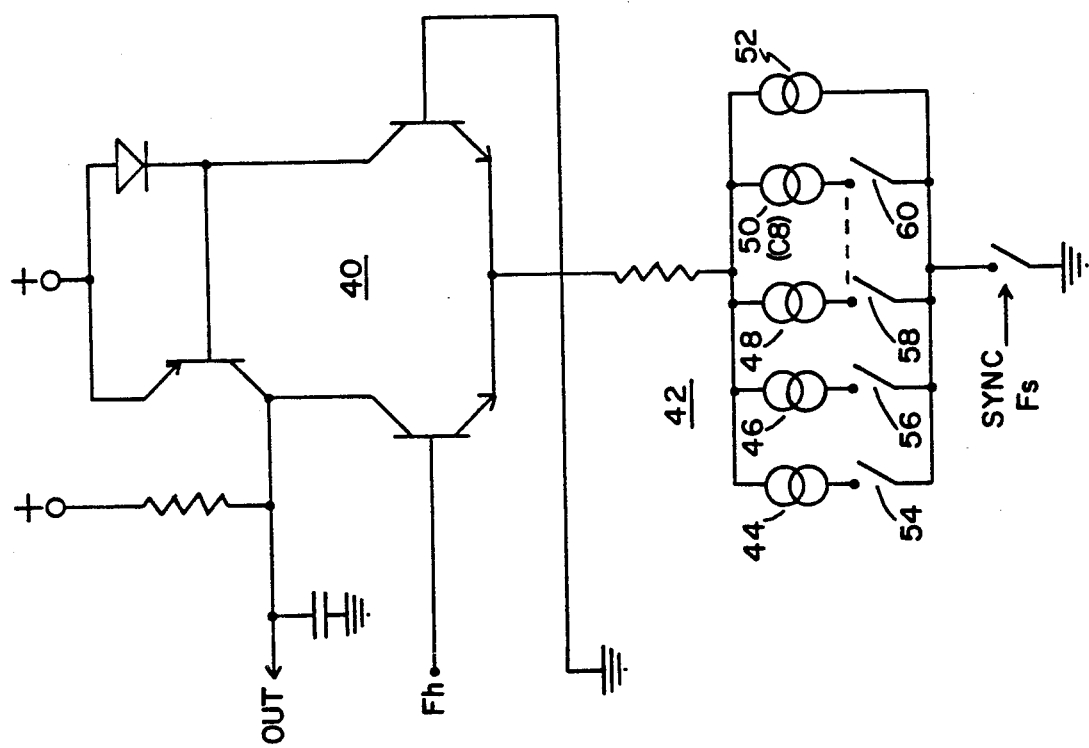
FIG. 3 is a partial schematic drawing of a weighted current source gain control arrangement for the phase detector.

Referring specifically to FIG. 3, a phase detector 40 having an input of Fh has its current changed by means of a plurality of current sources 44, 46, 48 and 50, which are selectively connected in the circuit by corresponding switches 54, 56, 58 and 60, respectively. A minimum value current source 52 is always in the circuit. It will be appreciated that the switches are electronic and are shown as mechanical single pole switches for illustrative purposes only. Thus, in response to the C1–C8 signals from FIG. 2, one of the switches 44-50 is closed to supplement the current supplied from current source 52 to phase detector 40 and increase its gain. As the relationship of the input sync signal and the reference oscillator signal approaches the locked condition, the gain is minimized, i.e. the smallest of the current sources 44–50 is coupled in the circuit. On the other hand, when the sync input signal and the reference signal are out of phase, the largest current source is connected in the circuit (in parallel with current source 52) and the gain of the phase detector is maximized.

It will be understood by those skilled in the art that the increments of gain control are a function of the number of discrete portion that the input signal period is divided into. While the arrangement illustrates eight discrete gain levels, a greater or lesser number is also contemplated and are well within the scope of the invention. The invention lends itself to integrated circuit techniques since simple flip-flops are all that is required. While not specifically disclosed, it should be understood that other variants of the invention come within the purview of the invention and are intended to be covered by the claims. The invention is to be limited only as defined in the claims.

What is claimed is:

1. The method of operating a phase detector comprising:
    establishing a variable gain characteristic that varies from a minimum to a maximum for said phase detector;
    operating said phase detector in a phase locked loop with a gain determined by said variable gain characteristic such that when in a locked condition, the gain of said phase detector is at said minimum and when in an unlocked condition, the gain of said phase detector is at said maximum, said gain of said phase detector increasing with increasing displacement from said locked condition to said unlocked condition.

2. The method of claim 1 wherein said variable gain characteristic is divided into discrete portions and further including:
    accessing said discrete portions of said variable gain characteristic as a function of the error signal in said phase locked loop.

3. The method of operating a phase detector comprising:
    establishing a variable gain characteristic that varies from a minimum to a maximum for said phase detector;
    operating said phase detector in a phase locked loop with a gain determined by said variable gain characteristic such that the gain of said phase detector is at said minimum when the absolute value of the phase error is minimum, and the gain of said phase detector is at said maximum when the absolute value of the phase error is maximum, said gain of said phase detector increasing with increasing displacement from the minimum phase error condition to the maximum phase error condition.

4. The method of claim 3 wherein said variable gain characteristic is divided into discrete time portions and further including:
    accessing said discrete time portions of said variable gain characteristic as a function of the phase error signal in said phase locked loop.

5. A phase locked loop including:
    an oscillator;
    a source of reference signal;
    a source of input signal;
    a phase detector controlling the frequency of said oscillator as a function of the phase difference between said reference signal and said input signal;
    means coupling said input signal and said reference signal to said phase detector, said phase detector developing an error signal for controlling said oscillator; and
    means for providing a variable gain characteristic for said phase detector as a function of said error signal whereby the gain of said phase detector is minimized in the locked condition of said phase locked loop and maximized in the unlocked condition of said phase locked loop.

6. The phase locked loop of claim 5 further including divider means coupled between said oscillator and said phase detector.

7. The phase locked loop of claim 6 wherein said divider means is programmable for enabling said phase locked loop to operate over a wide range of frequencies.

8. The phase locked loop of claim 6 wherein said variable gain means includes a plurality of current sources coupled to said phase detector for determining the gain thereof; and
    means for enabling said current sources as a function of said error signal.

9. The phase locked loop of claim 8 wherein said variable gain means further include a plurality of delay elements coupled to said oscillator and to said dividing means; and
    decoding means coupled to said delay elements for enabling said current sources.

* * * * *